United States Patent [19]

Wilhelm

[11] Patent Number: 4,897,285

[45] Date of Patent: Jan. 30, 1990

[54] METHOD AND APPARATUS FOR PCVD INTERNAL COATING A METALLIC PIPE BY MEANS OF A MICROWAVE PLASMA

[75] Inventor: Rolf Wilhelm, Munich, Fed. Rep. of Germany

[73] Assignee: Max-Planck-Gesellschaft zur Foerderung der Wissenschaften e.v., Fed. Rep. of Germany

[21] Appl. No.: 365,424

[22] Filed: Jun. 13, 1989

[30] Foreign Application Priority Data

Jun. 14, 1988 [DE] Fed. Rep. of Germany ....... 3820237

[51] Int. Cl.$^4$ ............................................. C23C 16/50
[52] U.S. Cl. ....................................... 427/39; 427/47; 118/723
[58] Field of Search ...................... 118/723; 427/39, 47

[56] References Cited

FOREIGN PATENT DOCUMENTS 3222189  1/1984  Fed. Rep. of Germany .
3516078  11/1986  Fed. Rep. of Germany ...... 118/723
3705666A1  9/1988  Fed. Rep. of Germany .

OTHER PUBLICATIONS

Leaflet, "New ECR Plasma Source", Jun. 25, 1987.

Dance, "Elektronen-Zyklotron-Resonanz", Elektronik-Fertigung, Oct. 22/30, 1987, pp. 136–138.

*Primary Examiner*—Richard Bueker
*Attorney, Agent, or Firm*—Handal & Morofsky

[57] ABSTRACT

A microwave plasma method/of depositing a coating of a prescribed material on the internal surface of a pipe by means of a reaction of a vapor phase providing a prescribed material in which:

(a) an atmosphere at a pressure less than atmospheric pressure containing the vapor phase is introduced into the pipe, (b) microwave energy is beamed into the pipe which is propagated along the length of the inside of the pipe, (c) a magnetic field is generated in a localized area of the pipe in which electron cyclotron resonance occurs for the the frequency of the microwaves, and in which, pressure, field strength of the magnetic field and the power of the high-frequency field are selected that a low-pressure gas discharge results in the area of the magnetic field to trigger the reaction furnishing the prescribed material, and (d) in which the magnetic field and thus the plasma are transposed along the length of the pipe.

6 Claims, 1 Drawing Sheet

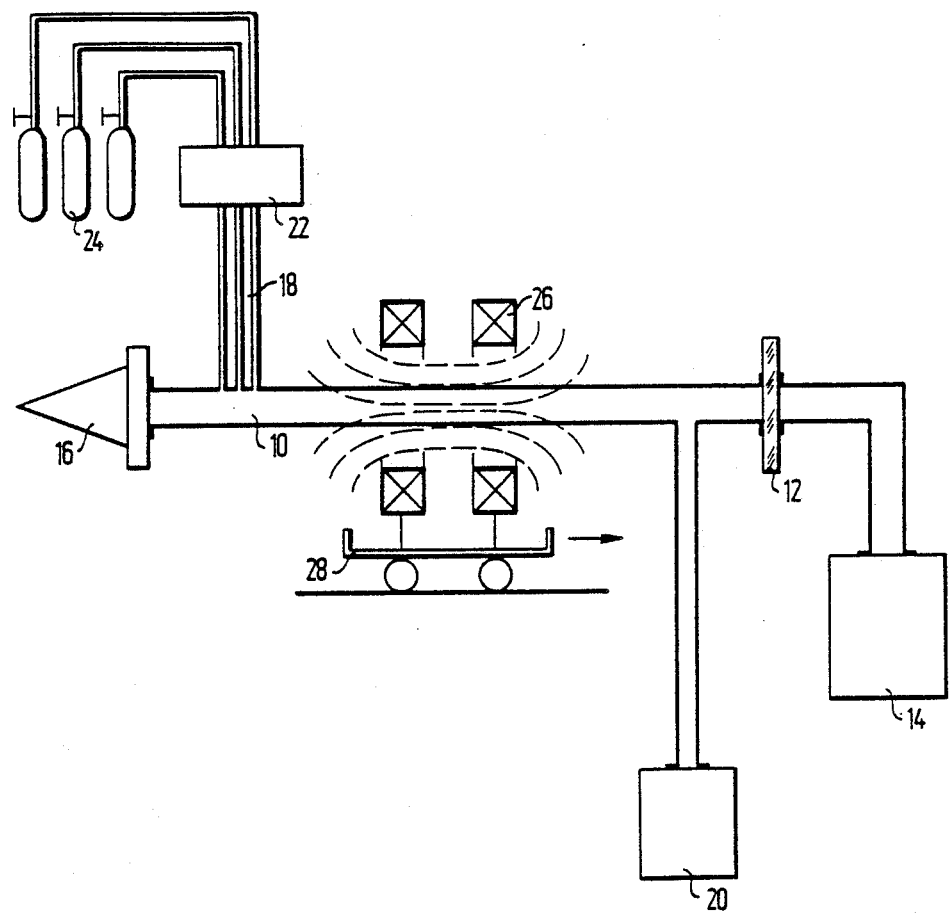

METHOD AND APPARATUS FOR PCVD INTERNAL COATING A METALLIC PIPE BY MEANS OF A MICROWAVE PLASMA

BACKGROUND OF THE INVENTION

The present invention relates to a microwave plasma method of depositing a coating of a prescribed material on the internal surface of a pipe; in addition, the invention relates to an apparatus for carrying out this method.

DESCRIPTION OF THE RELATED ART

Related art discloses a method of producing a thin film of a prescribed material by plasma-enhanced chemical vapor deposition from the gas phase producing the corresponding coating from the reaction involved. This chemical reaction may be a reduction, some other reaction or simply straight-forward decomposition. In the methods of related art the plasma is generated by beaming the microwaves produced by a horn antenna or similar apparatus into a chamber filled with a reaction gas in which the substrate to be coated is located. This method is generally termed "PCVD" (Plasma-enhanced Chemical Vapor Deposition). Such methods also disclose generating a plasma containing relatively low energy ions, thus permitting non-aggressive coating of the substrate by the application of a magnetic field having a field strength such that electron cyclotron resonance occurs at the microwave frequency ("ECR method") see e.g. DE-A-37 05 666 and 'Elektronik' 22/30.10. 1987-pages 136–138.

SUMMARY OF THE INVENTION

The object of the present invention is to disclose a microwave plasma method of coating the internal surface of a long pipe which is normally not accessible to a plasma and which comprises an electrically conducting material, particularly metal, at least on its internal surface.

In one embodiment of the microwave plasma method according to the invention for depositing a coating of a prescribed material on the internal surface of a pipe by means of the reaction of a vapor phase furnishing the prescribed material an atmosphere containing the vapor phase is introduced into the pipe at a pressure less than that of atmospheric;

microwave energy is fed into the pipe and allowed to propogate along the inside of the pipe;

a magnetic field is generated in a localized zone of the pipe in which electron cyclotron resonance occurs at the frequency of the microwaves, the pressure field strength of the magnetic field and the power of the high-frequency field being selected so that a low-pressure gas discharge takes place in the area of the magnetic field to produce the reaction furnishing the prescribed material, and thus moving the magnetic field and, accordingly, the plasma along the pipe.

In the present method a propogating microwave produces a longitudinally/localized ignition of a plasma discharge by cyclotron resonance inside the pipe. By moving the magnetic field along the pipe the location of the plasma within the pipe is shifted so that an homogenous plasma coating (or a plasma coating exhibiting the desired thickness profile) can be produced over long pipe sections.

The present method is excellently suited to internally coat lengthy hollow waveguides for microwaves. Such waveguides are often provided with an internal coating to prevent the breakdown field strength at high microwave power by suppressing secondary electron emission.

Pipes for handling fluids can be coated on the inside for corrosion-protection.

The present invention is generally suitable for producing all coatings which can be produced by conventional thermal or plasma enhanced CVD methods, i.e., for example, coatings of ceramic materials, such as TiC, TiN, SiC, $B_4C$.

BRIEF DESCRIPTION OF THE DRAWING

The following explains one embodiment of the invention with reference to the drawing, the sole FIGURE of which shows an apparatus for internally coating a hollow waveguide for microwaves by the method according to the invention.

DESCRIPTION OF THE PREFERRED EMBODIMENT

In the drawing the hollow microwave guide to be internally coated is identified by the reference numeral 10. The microwave guide can take the form of a straight pipe, a few meters long, of rectangular cross-section. One end of the waveguide 10 is connected to a microwave generator 14 via a vacuum-tight window 12. A microwave absorber 16 is connected to the other end. The microwave guide 10 is also connected in the vicinity of the absorber end to a piping system (tubing) for introducing the reaction (working) gases, and at the window end to a vacuum pump 20. The piping system 18 is connected via apparatus 22 for flow control to working gas vessels 24. The waveguide 10 is also surrounded by an assembly of magnetic coils 26 comprising two annular-shaped coils spaced away from each other and connected to a supply of direct current and which can be shifted by a moving device 28, such as a carriage, along the length of the waveguide 10.

In executing the present method the working gases from the vessels 24 are introduced into the hollow microwave guide 10 via the flow control apparatus 22 and pumped down by pumps 20 at such a rate that a suitable low pressure is created to permit a low-pressure gas discharge materializing in the area of the waveguide 10 to be coated. The magnetic coil assembly 28 is then activated and then the microwave generator 24 is started to supply microwave energy into the waveguide, the frequency of this energy being such that it propogates along the waveguide and is finally absorbed by the absorber to the extent that it is otherwise not consumed by the plasma.

The pressure in the waveguide 10, the magnetic field strength in the localized area of the waveguide 10 and the microwave frequency and power are all selected so that electron cyclotron resonance occurs in the area of the magnetic field in the waveguide (10) to produce in this area a local low-pressure gas discharge to trigger the reaction in the working gas for furnishing the desired coating material. The magnetic coil assembly 28 and thus the plasma discharge are shifted along the length of the waveguide 10 so that the coating zone is disposed along the interior wall of the waveguide 10 to the length as desired.

The gas density is preferably selected so that the collision frequency of the electrons is significantly lower than the electron cyclotron frequency, i.e. the applied high frequency.

Since the gas discharge and, accordingly, the deposition of the coating material occurs in the area of the magnetic field necessary for the gas discharge, location and thickness of the deposition can be maintained to good effect.

EXAMPLE

The following parameters were used in obtaining the internal coating of a 6 meter long rectangular, copper waveguide dimensioned for 2.45 GHz:

microwave frequency: 2.45 GHz;
microwave power at output of generator: about 0.5 kW
local magnetic field strength in area of coating: 0.087 T (870 Gauß);
gas density typically a few microbars

I claim:

1. A microwave plasma method of depositing a coating of a prescribed material on a surface by means of a reaction of a vapor phase providing the prescribed material in which:
   (a) adjacent the surface to be coated, an atmosphere containing said vapor phase is created at a pressure less than atmospheric pressure;
   (b) in a region of the surface to be coated, a magnetic field is generated, and p1 (c) in the region of the surface to be coated, a high-frequency field is generated
   and in which, pressure, field strength of the magnetic field and the frequency and power of the high-frequency field are all selected so that electron cyclotron resonance occurs in the region of the magnetic field, causing a low-pressure gas discharge to trigger the reaction furnishing the prescribed material, wherein for internally coating a pipe having at least its internal surface of metal, microwave energy is supplied into said pipe at a frequency which is propogated along said pipe and wherein said magnetic field is generated in a localized length of said pipe and transposed in the longitudinal direction of said pipe.

2. A method according to claim 1 wherein the pressure adjacent the surface to be coated has a magnitude of a few microbars.

3. An apparatus for internally coating a pipe by means of a PCVD method, said apparatus comprising: p1 a microwave generator (14) coupled to one end of the pipe (10);
   means (22, 24) connected to said pipe (10) for supplying the working gases;
   vacuum pump means (20) connected to said pipe (10);
   means (28) for generating a magnetic field adapted to be shifted along the length of said pipe (10).

4. An apparatus according to claim 3 wherein a microwave absorber (16) is coupled to the end of said pipe (10) opposite to the end connecting said microwave generator (14).

5. An apparatus according to claim 3 wherein a vacuum-tight window is provided between said microwave generator (14) and said pipe (10).

6. An apparatus according to claim 3 wherein said pipe (10) is an hollow waveguide for microwaves.

* * * * *